US008697562B2

(12) United States Patent
McCreery et al.

(10) Patent No.: US 8,697,562 B2
(45) Date of Patent: Apr. 15, 2014

(54) METAL CONTACTS FOR MOLECULAR DEVICE JUNCTIONS AND SURFACE-DIFFUSION-MEDIATED DEPOSITION

(76) Inventors: Richard L. McCreery, Edmonton (CA); Andrew P. Bonifas, Champaign, IL (US); Vicki Wai-Shum Lui, Edmonton (CA)

(*) Notice: Subject to any disclaimer, the term of this patent is extended or adjusted under 35 U.S.C. 154(b) by 291 days.

(21) Appl. No.: 13/167,201

(22) Filed: Jun. 23, 2011

(65) Prior Publication Data

US 2012/0326316 A1    Dec. 27, 2012

(51) Int. Cl.
*H01L 21/44*    (2006.01)

(52) U.S. Cl.
USPC .......................................... 438/597; 438/542

(58) Field of Classification Search
USPC .......... 438/542, 597, 686, 687; 257/E21.158, 257/E23.01
See application file for complete search history.

(56) References Cited

U.S. PATENT DOCUMENTS

| | | | |
|---|---|---|---|
| 5,024,896 A | 6/1991 | Mathad et al. | |
| 5,654,232 A | 8/1997 | Gardner | |
| 5,897,370 A | 4/1999 | Joshi et al. | |
| 6,518,168 B1 | 2/2003 | Clem et al. | |
| 6,541,309 B2 | 4/2003 | Chen | |
| 6,703,300 B2 | 3/2004 | Jackson | |
| 6,756,302 B1 | 6/2004 | Shan et al. | |
| 7,279,702 B2 | 10/2007 | Huisman et al. | |
| 7,880,165 B2 | 2/2011 | Lee et al. | |
| 8,357,607 B2* | 1/2013 | Oya et al. | 438/605 |
| 2006/0183309 A1* | 8/2006 | Asscher et al. | 438/597 |

OTHER PUBLICATIONS

Haick, Hossam, et al., "Electrical Contacts to Organic Molecular Films by Metal Evaporation: Effect of Contacting Details," J. Phys. Chem. C, American Chemical Society, Jul. 9, 2007, vol. 111, No. 5, pp. 2318-2329.

Haick, Hossam, et al., "Contacting Organic Molecules by Soft Methods: Towards Molecule-Based Electronic Devices," Acc. Chem. Res., American Chemical Society, Jan. 31, 2008, vol. 41, No. 3, pp. 359-366.

McCreery, Richard L., et al., "Progress with Molecular Electronic Junctions: Meeting Experimental Challenges in Design and Fabrication," Advanced Materials, Wiley-VCH Verlag GmbH & Co. KGaA, Weinheim, Nov. 20, 2009, vol. 21, Issue 43, pp. 4303-4322.

Metzger, Robert M., "Unimolecular Rectifiers: Present Status," Chemical Physics, Elsevier B.V., Jul. 11, 2006, vol. 326, Issue 1, pp. 176-187.

Bonifas, Andrew P., et al., "'Soft' Au, Pt and Cu contacts for molecular junctions through surface-diffusion-mediated deposition," Nature Nanotechnology, vol. 5, published online: Jun. 27, 2010, pp. 612-617.

(Continued)

*Primary Examiner* — Hung Vu
(74) *Attorney, Agent, or Firm* — Blakely Sokoloff Taylor Zafman LLP

(57) ABSTRACT

Metal contact formation for molecular device junctions by surface-diffusion-mediated deposition (SDMD) is described. In an example, a method of fabricating a molecular device junction by surface-diffusion-mediated deposition (SDMD) includes forming a molecular layer above a first region of a substrate. A region of metal atoms is formed above a second region of the substrate proximate to, but separate from, the first region of the substrate. A metal contact is then formed by migrating metal atoms from the region of metal atoms onto the molecular layer.

20 Claims, 11 Drawing Sheets

(56) References Cited

OTHER PUBLICATIONS

Abelmann, Leon et al., "Oblique evaporation and surface diffusion", Elsevier Science S.A., Thin Solid Films 305, 1997, 21 Pages.

Anariba, Franklin et al., "Comprehensive Characterization of Hybrid Junctions Comprised of a Porphyrin Monolayer Sandwiched Between a Coinage Metal Overlayer and a Si(100) Substrate", J. American Chemical Society, J. Phys. Chem. C, 112, Jun. 4, 2008, 12 Pages.

Anariba, Franklin et al., "Mono- and Multilayer Formation by Diazonium Reduction on Carbon Surfaces Monitored with Atomic Force Microscopy "Scratching"", Analytical Chemistry, vol. 75, No. 15, Aug. 1, 2003, 8 Pages.

Beebe, Jeremy M. et al., "Measuring Relative Barrier Heights in Molecular Electronic Junctions with Transition Voltage Spectroscopy", American Chemical Society, NANO, vol. 2, No. 5, 2008, 6 Pages.

Bergren, Adam J. et al., "Molecular electronics using diazonium-derived adlayers on carbon with Cu top contacts: critical analysis of metal oxides and filaments", Journal of Physics: Condensed Matter 20, 374117, Aug. 26, 2008, 11 Pages.

Blum, Amy S. et al., "Molecularly inherent voltage-controlled conductance switching", Nature Materials, vol. 4, Feb. 2005, 6 Pages.

Bonifas, Andrew P. et al., ""Soft" Au, Pt, and Cu Contacts for Molecular Junctions via Surface Diffusion Mediated Deposition", Nature Nanotechnology, Supplementary Information, 2010, 11 Pages.

Brault, Pascal et al., "Anomalous Diffusion Mediated by Atom Deposition into a Porous Substrate", The American Physical Society, Physical Review Letters,102, 045901, Jan. 30, 2009, 4 Pages.

Brooksby, Paula A. et al., "Electrochemical and Atomic Force Microscopy Study of Carbon Surface Modification via Diazonium Reduction in Aqueous and Acetonitrile Solutions", American Chemical Society, Langmuir, 20, May 13, 2004, 8 Pages.

Chabinyc, Michael L. et al., "Molecular Rectification in a Metal-Insulator-Metal Junction Based on Self-Assembled Monolayers", J. American Chemical Society, Sep. 10, 2002, 124, 7 Pages.

Choi, Seong H. et al., "Electrical Resistance of Long Conjugated Molecular Wires", Science, vol. 320, Jun. 13, 2008, 5 Pages.

Choi, Seong H. et al., "Supporting Online Material for Electrical Resistance of Long Conjugated Molecular Wires", Science vol. 320, No. 3882, Jun. 13, 2008, 1482, 21 Pages.

Deinhammer, Randall S. et al., "Electrochemical Oxidation of Amine-Containing Compounds: A Route to the Surface Modification of Glassy Carbon Electrodes", American Chemical Society, Langmuir 10, Feb. 4, 1994, 8 Pages.

Dunker, Melvin F. et al., "The Preparation of Some Organic Mercurials from Diazonium Borofluorides", Contribution from the Research Laboratories of the School of Pharmacy of the University of Maryland, vol. 58, Nov. 1936, 2 Pages.

Engelkes, Vincent B. et al., "Length-Dependent Transport in Molecular Junctions Based on SAMs of Alkanethiols and Alkanedithiols: Effect of Metal Work Function and Applied Bias on Tunneling Efficiency and Contact Resistance", J. American Chemical Society, Oct. 9, 2004, 126, 10 Pages.

Haick, Hossam et al., "Contacting organic molecules by metal evaporation", Phys. Chem. Chem. Phys., 6, Aug. 31, 2004, 4 Pages.

Haick, Hossam et al., "Making contact: Connecting molecules electrically to the macroscopic world", Elsevier Ltd., ScienceDirect, Progress in Surface Science 83, 2008, 45 Pages.

Holmlin, R. E. et al., "Electron Transport through Thin Organic Films in Metal-Insulator-Metal Junctions Based on Self-Assembled Monolayers", J. American Chemical Society, May 4, 2001, 123, 11 Pages.

Kariuki, James K. et al., "Formation of Multilayers on Glassy Carbon Electrodes via the Reduction of Diazonium Salts", American Chemical Society, Langmuir, 17, Aug. 24, 2001, 5 Pages.

Li, Peng et al., "HRTEM and Nano-Beam Diffraction Analysis of Metal-Molecule Interface", Microscopy Society of America, Microsc. Microanal. 16 (Suppl 2), 2010, 2 Pages.

Liu, C. L. et al., "EAM study of surface self-diffusion of single adatoms of fcc metals Ni, Cu, Al, Ag, Au, Pd, and Pt", Elsevier Science Publishers B. V., North-Holland, Surface Science 253, Feb. 7, 1991, 11 Pages.

Love, J. Christopher et al., "Self-Assembled Monolayers of Thiolates on Metals as a Form of Nanotechnology", American Chemical Society, Mar. 25, 2005, 105, 68 Pages.

Mahmoud, Amr M. et al., "Derivatization of Optically Transparent Materials with Diazonium Reagents for Spectroscopy of Buried Interfaces", Analytical Chemistry, vol. 81, No. 16, Aug. 15, 2009, 9 Pages.

Malac, Marek et al., "Low-dose performance of parallel-beam nanodiffraction", Elsevier B.V., Ultramicroscopy 109, Jul. 8, 2008, 8 Pages.

Metzger, Robert M. et al., "Electrical Rectification by a Monolayer of Hexadecylquinolinium Tricyanoquinodimethanide Measured between Macroscopic Gold Electrodes", J. Phys. Chem. B, Jul. 7, 2001, 105, 11 Pages.

Nowak, Aletha M. et al., "Characterization of Carbon/Nitroazobenzene/Titanium Molecular Electronic Junctions with Photoelectron and Raman Spectroscopy", Analytical Chemistry, vol. 76, No. 4, Feb. 15, 2004, 9 Pages.

Pinson, Jean et al., "Attachment of organic layers to conductive or semiconductive surfaces by reduction of diazonium salts", Chemical Society Reviews, Feb. 23, 2005, 34, 11 Pages.

Rácz, Zoltán et al., "Characterization and control of unconfined lateral diffusion under stencil masks", J. Vacuum Science Technology, B25(3), May/Jun. 2007, 5 Pages.

Ramsey, Jeremy et al., "Performance Comparisons of Conventional and Line-Focused Surface Raman Spectrometers", Society for Applied Spectroscopy, vol. 55, No. 6, Feb. 26, 2001, 7 Pages.

Ranganathan, Srikanth et al., "Electroanalytical Performance of Carbon Films with Near-Atomic Flatness", Analytical Chemistry, vol. 73, No. 5, Mar. 1, 2001, 8 Pages.

Reddy, Pramod et al., "Thermoelectricity in Molecular Junctions", Science, vol. 315, Mar. 16, 2007, 4 Pages.

Richter, Curt A. et al., "Electrical and Spectroscopic Characterization of Metal-Monolayer/Si Devices", J. Phys. Chem. B, 109, Nov. 2, 2005, 6 Pages.

Richter, C. A. et al., "Electrical characterization of Al/AlOx/molecule/Ti/Al devices", Applied Physics A, 80, Mar. 11, 2005, Springer-Verlag 2005, 8 Pages.

Rossnagel, S. M., "Directional and preferential sputtering-based physical vapor deposition", Elsevier Science S.A., Thin Solid Films 263, 1995, 12 Pages.

Scott, Adina et al., "Fabrication and characterization of metal-molecule-silicon devices", American Institute of Physics, Applied Physics Letters 91, 033508, Jul. 18, 2007, 3 Pages.

Speller, S. et al., "Surface Mobility on the Au(110) surface observed with scanning tunneling microscopy", Elsevier Science B.V., Surface Science 312, Mar. 11, 1994, 5 Pages.

Van Hal, Paul A. et al., "Upscaling, integration and electrical characterization of molecular junctions", Nature nanotechnology, vol. 3, Dec. 2008, 6 Pages.

Walker, A. V. et al., "Chemical Pathways in the Interactions of Reactive Metal Atoms with Organic Surfaces: Vapor Deposition of Ca and Ti on a Methoxy-Terminated Alkanethiolate Monolayer on Au", J. Phys. Chem. B, 109, May 14, 2005, 10 Pages.

\* cited by examiner

METAL CONTACTS FOR MOLECULAR DEVICE JUNCTIONS AND SURFACE-DIFFUSION-MEDIATED DEPOSITION

TECHNICAL FIELD

Embodiments of the present invention are in the field of molecular electronic devices and, in particular, metal contact formation for molecular device junctions by surface-diffusion-mediated deposition (SDMD).

BACKGROUND

Molecular electronics is the study of charge transport through single molecules or molecular ensembles. The term "molecular junction" may be used to describe a single molecule or a molecular ensemble oriented in parallel between conducting contacts, and may be viewed as the basic component of molecular electronics. Charge transport through molecules has been investigated with techniques such as scanning tunneling microscopy, conducting probe atomic force microscopy (AFM) and vapor deposition of top contacts. Current-voltage measurements on molecular junctions have exhibited phenomena such as rectification and conductance switching. The introduction of molecular electronic components into integrated circuits may be a primary goal of the field.

Numerous approaches have been used to fabricate molecular layers on conducting surfaces, including self-assembly, Langmuir-Blodgett techniques, and the formation of C—C or Si—C irreversible bonds (3.5-4.0 eV) between a substrate and a molecular layer. Irreversible bonding may provide the molecular layer with structural stability during subsequent fabrication and characterization processes, thus reducing the likelihood of molecular damage or metal penetration. Although the resulting layers may be less ordered than self-assembled monolayers (SAMs), irreversible bonding may allow the formation of molecular multilayer structures in which the thickness may be controlled by altering the deposition conditions.

Although significant progress has been made in the field, the ability to fabricate robust junctions with high yields has proven experimentally difficult, primarily due to problems associated with the formation of the second contact. Contact formation through vapor deposition (e.g., metal evaporation) may have several benefits, including the possibility of parallel fabrication, the ability to form contacts with varying work functions, and its compatibility with semiconductor processing. However, vapor deposition may have experimental limitations such as metal penetration through the molecular layer and molecular damage, possibly resulting in behavior characteristic of electronic shorts.

By using spectroscopic techniques, it has been shown that direct evaporation of reactive metals such as titanium (Ti) may result in significant structural damage to the molecular layer. Direct evaporation of noble metals commonly results in partial molecular damage, molecular displacement at the substrate/molecule interface, or penetration between the molecules, for example, in the case of gold (Au). These results may depend strongly on the substrate/molecule bonding characteristics, the type of molecular layer and terminal groups. Fabrication techniques have been developed to mitigate metal penetration and molecular damage, including spin-coating of a conducting polymer contact, indirect evaporation, and the evaporation of copper (Cu).

Vapor deposition of metals onto "soft" materials such as organic electronic materials and molecular monolayers often results in damage to the molecular layer or penetration of metal atoms into the layer. The result can be changes in molecular structure, or "short circuits" caused by metal filaments formed during penetration. This problem has been severe in molecular electronics, since many of the molecular structures are very thin (e.g., less than 5 nanometers) and fragile, and subject to thermal damage during metal deposition. The penetration of metals into such thin films often results in direct contact of the metal to the substrate, bypassing the molecular layer altogether.

Metal deposition onto organic materials is generally avoided in current technology, or the organic layer is sufficiently thick that some metal penetration can be tolerated. Many organic materials simply may not tolerate vapor deposition of metals, often resulting in low device yield or drastically modified device properties.

Conventional metal deposition onto a soft material may subject the material to both kinetic energy and temperature excursions. The heat of condensation of a metal atom is typically 3-4 eV, enough to break bonds and modify structures of organic molecules. As noted above, metal penetration is often a problem, resulting in low device yield. Most methods for metal vapor deposition onto soft targets are inefficient or cumbersome, such as "thermalizing" the metal ions with a low pressure of inert gas.

Thus, significant improvements are needed in the evolution of molecular electronic device technology.

SUMMARY

Embodiments of the present invention include metal contacts for molecular device junctions and surface-diffusion-mediated deposition (SDMD).

In an embodiment, a method of fabricating a molecular device junction by surface-diffusion-mediated deposition (SDMD) includes forming a molecular layer above a first region of a substrate. A region of metal atoms is then formed above a second region of the substrate proximate to, but separate from, the first region of the substrate. A metal contact is then formed by migrating metal atoms from the region of metal atoms onto the molecular layer.

In another embodiment, a method of fabricating a molecular device junction by surface-diffusion-mediated deposition (SDMD) includes forming a pyrolyzed photoresist film (PPF) above a substrate. A molecular layer is formed on the PPF. A region of metal atoms is formed above the substrate proximate to, but separate from, the molecular layer. A metal contact is formed by migrating metal atoms from the region of metal atoms onto the molecular layer.

In another embodiment, a method of fabricating a molecular device junction by surface-diffusion-mediated deposition (SDMD) includes forming a dielectric layer above a substrate. A molecular layer is formed on the dielectric layer. A region of metal atoms is formed above the substrate proximate to, but separate from, the molecular layer. A metal contact is formed by migrating metal atoms from the region of metal atoms onto the molecular layer.

DETAILED DESCRIPTION

Figure 1:
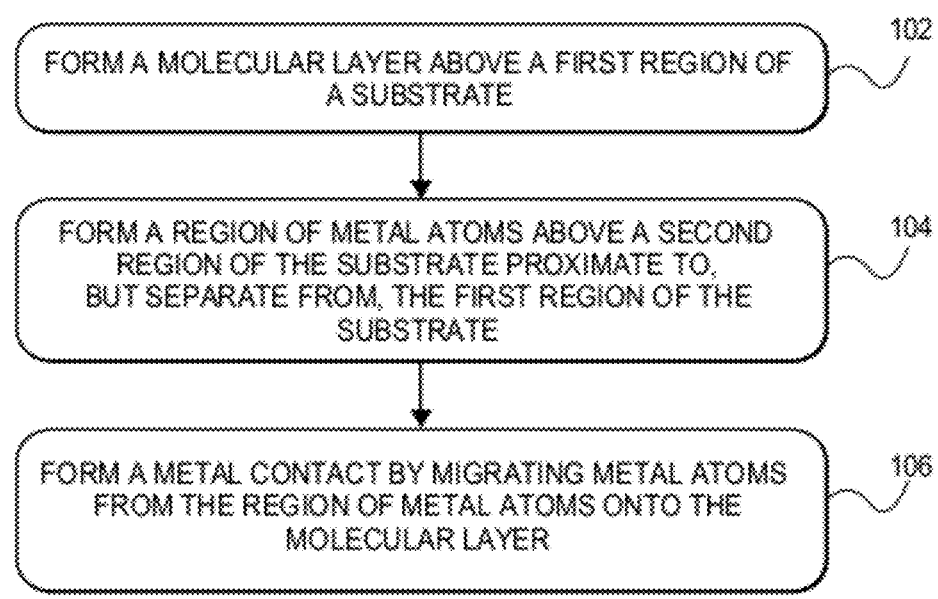
FIG. 1 illustrates a flowchart representing operations in a method of fabricating a metal contact for a molecular device junction by surface-diffusion-mediated deposition (SDMD), in accordance with an embodiment of the present invention.

Metal contact formation for molecular device junctions by surface-diffusion-mediated deposition (SDMD) is described herein. In the following description, numerous specific details are set forth, such as specific molecular identities and SDMD formation arrangements, in order to provide a thorough understanding of embodiments of the present invention. It will be apparent to one skilled in the art that embodiments of the present invention may be practiced without these specific details. In other instances, well-known processing or fabrication techniques, such as metal or dielectric layer patterning techniques, are not described in detail in order to not unnecessarily obscure embodiments of the present invention. Furthermore, it is to be understood that the various embodiments shown in the Figures are illustrative representations and are not necessarily drawn to scale.

Virtually all types of molecular electronic devices depend on electronically addressing a molecule or molecular layer through the formation of a metallic contact. The introduction of molecular devices into integrated circuits may depend on the formation of contacts using a vapor deposition technique, but this approach frequently results in the metal atoms penetrating or damaging the molecular layer. In accordance with an embodiment of the present invention, described herein is a method of forming "soft" metallic contacts on molecular layers through surface-diffusion-mediated deposition (SDMD), in which the metal atoms are deposited remotely and then diffuse onto the molecular layer. In one embodiment, using the SDMD approach mitigates or eliminates the problems of penetration and damage. In an embodiment, molecular junctions fabricated by SDMD exhibit excellent yield (e.g., typically >90%) and reproducibility, and allow examination of the effects of molecular-layer structure, thickness and contact work function. In an embodiment, contacts formed by SDMD are less prone to defects. SDMD may provide a route to providing "cold metal" to the contact location since kinetic energy is dissipated away from the desired placement location. In an embodiment, an SDMD approach takes advantage of an inherent stability of the C—C bond between the molecular layer and a conducting carbon substrate. Molecular structure and electronic coupling between the molecules and the substrate may influence charge transport through molecular junctions in the SDMD approach.

In an embodiment, SDMD provides a technique for the formation of metallic contacts. In one embodiment, contact formation is achieved by direct electron-beam evaporation of a metal (Au, Cu, Pt, Ag) onto a silicon dioxide ($SiO_2$) surface adjacent to and approximately in the range of 10-500 nanometers away from a molecular layer. In a specific embodiment, a $SiO_2$ "overhang" fabricated above the molecular layer protects the molecules from direct impingement of metal atoms and source radiation. Surface diffusion of the metal adatoms on the $SiO_2$ surface allows adatom migration onto the molecular layer to form a contact. In an embodiment, the indirect approach of SDMD allows for the formation of robust gold (Au), copper (Cu), platinum (Pt), or silver (Ag) contacts on molecular layers having a thickness approximately in the range of 1-100 nanometers, and may provide a yield of greater than 90%. In SDMD, the deposition of metal atoms only contacts "soft" materials by diffusion, when they have lost most of their energy. This approach is distinguished from conventional direct deposition approaches.

FIG. 1 illustrates a Flowchart 100 representing operations in a method of fabricating a metal contact for a molecular device junction by SDMD, in accordance with an embodiment of the present invention. Referring to operation 102 of Flowchart 100, a method of fabricating a molecular device junction by surface-diffusion-mediated deposition (SDMD) includes forming a molecular layer above a first region of a substrate. Referring to operation 104 of Flowchart 100, a region of metal atoms is formed above a second region of the substrate proximate to, but separate from, the first region of the substrate. Although in accordance with one embodiment, Flowchart 100 shows operation 102 performed prior to operation 104, in another embodiment, operation 104 is performed prior to operation 102, or, in another embodiment, operations 102 and 104 are performed simultaneously. Then, referring to operation 106 of Flowchart 100, a metal contact is then formed by migrating metal atoms from the region of metal atoms onto the molecular layer.

As a specific example of the method of Flowchart 100, FIGS. 2A-2H illustrate cross-sectional views representing operations in a method of fabricating a metal contact for a molecular device junction by SDMD, in accordance with an embodiment of the present invention.

Figure 2A:
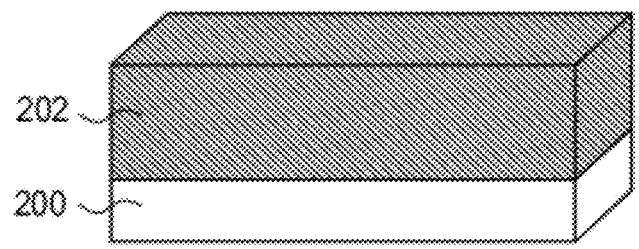
FIGS. 2A-2H illustrate cross-sectional views representing operations in a method of fabricating a metal contact for a molecular device junction by SDMD, in accordance with an embodiment of the present invention.
Figure 2B:
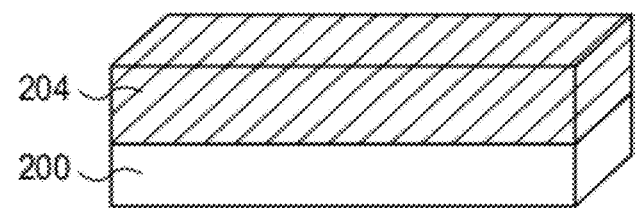
Figure 2C:
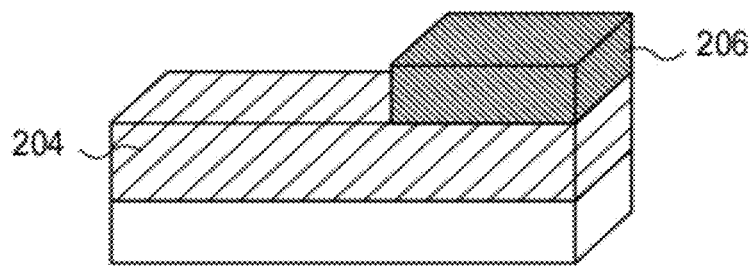
Figure 2D:
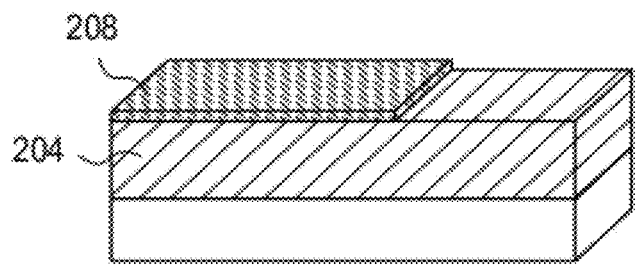

Referring to FIG. 2A, a photoresist layer 202 is formed above a layer of silicon dioxide 200 by a spin coating technique. The layer of silicon dioxide 200 may be approximately 300 nanometers thick. The photoresist layer 202 is pyrolyzed to provide a pyrolyzed photoresist film (PPF) 204 above the layer of silicon dioxide 200, as depicted in FIG. 2B. Referring to FIG. 2C, a patterned photoresist layer 206 is formed above a portion of the pyrolyzed photoresist film (PPF) 204. An etch mask 208 (e.g., a chromium (Cr)/$SiO_2$ layer formed by evaporation) is then formed above the pyrolyzed photoresist film (PPF) 204, and the patterned photoresist layer 206 is removed, as depicted in FIG. 2D.

Figure 2E:
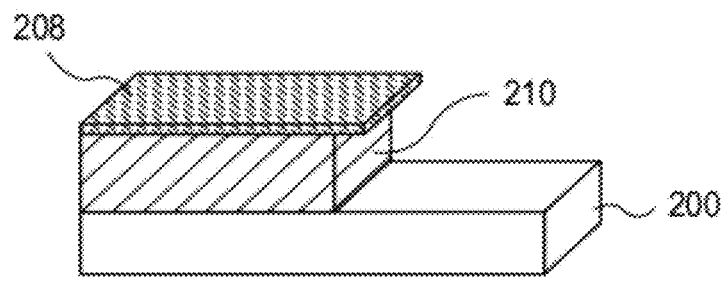
Figure 2F:
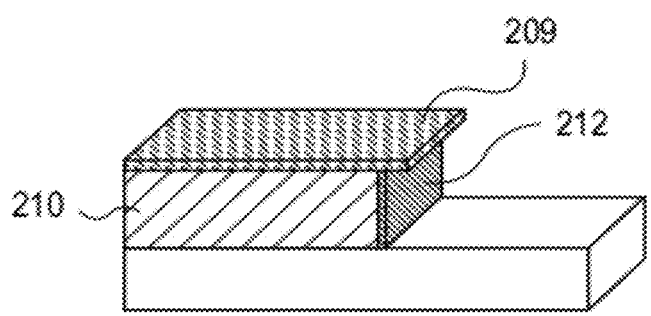
Figure 2G:
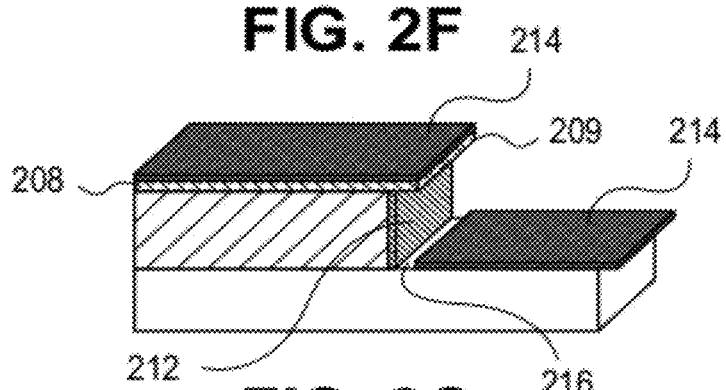
Figure 2H:
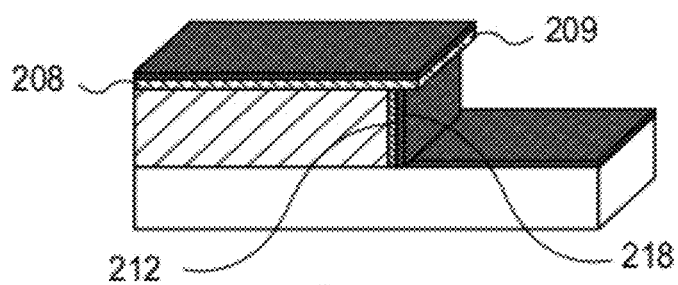

Referring to FIG. 2E, the pyrolyzed photoresist film (PPF) 204 is patterned, e.g., by a reactive ion etch using oxygen ($O_2$), to undercut a portion of the etch mask 208, forming a patterned pyrolyzed photoresist film (PPF) 210 and exposing a portion of the layer of silicon dioxide 200. A molecular layer 212 is then formed on the sidewall of the patterned pyrolyzed photoresist film (PPF) 210, underneath the overhang portion 209 of the etch mask 208, as depicted in FIG. 2F. Referring to FIG. 2G, a metal electrode forming layer 214, e.g., a gold layer, is formed on the exposed portions of the structure of FIG. 2F, but not on the molecular layer 212 underneath the overhang portion 209 of the etch mask 208. A gap 216 remains between the molecular layer 212 and the metal electrode forming layer 214. Metal atoms of the metal electrode forming layer 214, e.g., individual gold atoms, migrate by SDMD to form a metal contact layer 218 on the molecular layer 212, underneath the overhang portion 209 of the etch mask 208, as depicted in FIG. 2H.

Thus, an SDMD approach may be used to fabricate a molecular junction. Overall, in an embodiment, a pyrolyzed photoresist film (PPF) is fabricated on a silicon substrate with an approximately 300 nanometer thick layer of insulating $SiO_2$ thereon. The PPF layer may be structurally similar to glassy carbon, and may provide the necessary surface chemistry to allow the formation of a C-C bond between the conducting PPF substrate and the molecular layer. A patterned etch mask is fabricated on top of the PPF surface using optical lithography, evaporation of Cr (e.g., approximately 3 nanometers) and $SiO_2$ (e.g., approximately 27 nanometers), and lift-off in acetone. An $O_2$ reactive ion etch process is used to etch the unmasked PPF, with conditions suitable to create a near vertical sidewall with uniform undercutting beneath the etch mask. The uniform undercutting caused the Cr/$SiO_2$ etch mask to overhang the underlying PPF sidewall.

In an embodiment, PPF fabrication may be performed by a process suitable to provide a pyrolyzed layer. For example, in one embodiment, an underlying substrate is composed of an approximately 1 millimeter thick fused silica microscope slide or a p-type silicon (p-Si) substrate with an approximately 300 nanometer thick thermal $SiO_2$ insulation layer. The substrate may be ultrasonically cleaned with sequential immersion in acetone, deionized water (TOC<3 ppb), and isopropanol for approximately 10 minutes. An argon (Ar) stream may be used to dry the substrate. To form a pyrolyzed photoresist film (PPF), in one embodiment, the substrate is spin coated with photoresist AZ P4330-RS at 6000 rpm for 30 seconds, soft baked at 90 degrees Celsius for approximately 10 minutes, and pyrolyzed in a tube furnace. For the pyrolysis process, a temperature ramp rate of approximately 8 Celsius degrees per minute may be used and held at approximately 1000 degrees Celsius for approximately 60 minutes in the presence of forming gas (e.g., 5% hydrogen and 95% nitrogen) flowing at approximately 100 cc/min. In a specific embodiment, metal tubing with brass fittings is used between the forming gas source and tube furnace to ensure the purity and $H_2$ content of the forming gas. The thickness of the PPF may be between approximately 700-800 nanometers as measured with a profilometer. For junctions fabricated through direct metal evaporation, e.g., as control samples for comparative purposes, in one embodiment, optical lithography is used to pattern the photoresist layer prior to pyrolysis, resulting in PPF lines approximately 1 millimeter×18 millimeters.

For PPF sidewall fabrication, in an embodiment, optical lithography (e.g., on HPR504 photoresist) is used to pattern a reactive ion etch (RIE) etch mask on the PPF layer through a lift-off technique. The etch mask may be formed with electron beam evaporation of approximately 3 nanometer Cr (adhesion layer) and approximately 27 nanometers $SiO_2$ followed by lift-off in acetone. Chamber pressure during evaporation is, in one embodiment, less than approximately $1\times10^{-7}$ torr with deposition rates of approximately 0.2 and 0.5 $Å·s^{-1}$ for the Cr and $SiO_2$ layers, respectively. Final dimensions of the Cr/$SiO_2$ etch mask may be approximately 1 millimeter×18 millimeters. The PPF is etched, in one embodiment, with an $O_2$ RIE process to remove the PPF not protected by the etch mask. The RIE parameters may be approximately 200 watt RF plasma, $O_2$ pressure of approximately $150\times10^{-3}$ ton, and substrate DC bias of approximately 360 V. In one embodiment, the DC bias is used to cause an anisotropic etch allowing for the formation of a near vertical sidewall. Uniform etching under the etch mask may cause the etch mask to form the desired protective overhang. PPF is, in one embodiment, selected as the bottom contact because of the ability to create the sidewall geometry with an $O_2$ RIE. It is to be understood that embodiments of the present invention are not limited to PPF as there exists methods for the fabrication of junction architectures using metals.

Figure 3A:
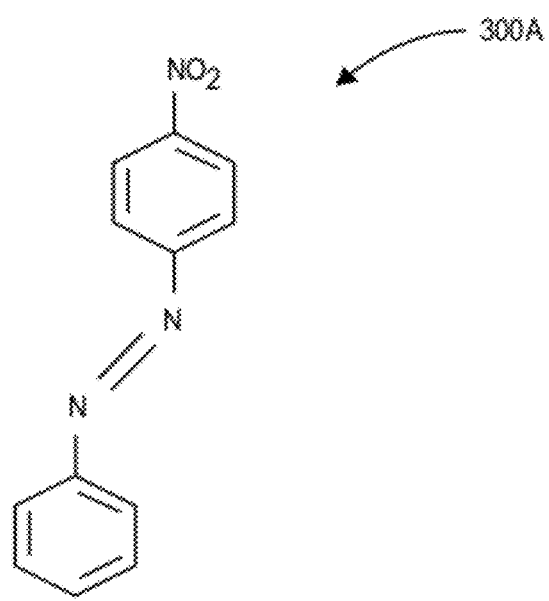
FIG. 3A illustrates a chemical structure of a 4-nitroazobenzene (NAB) molecule, in accordance with an embodiment of the present invention.
Figure 3B:
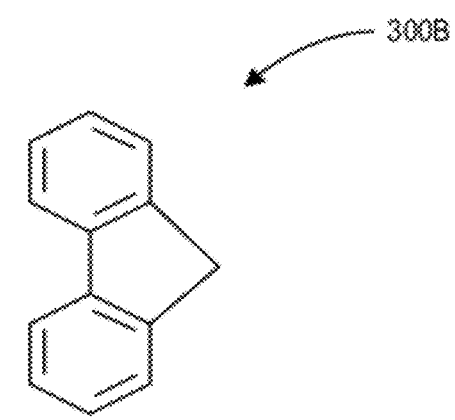
FIG. 3B illustrates a chemical structure of a fluorene (FL) molecule, in accordance with an embodiment of the present invention.

FIG. 3A illustrates a chemical structure 300A of a 4-nitroazobenzene (NAB) molecule, in accordance with an embodiment of the present invention. FIG. 3B illustrates a chemical structure 300B of a fluorene (FL) molecule, in accordance with an embodiment of the present invention. Although NAB and FL are used herein for illustrative purposes, other molecules, in particular, other aromatic molecules, may be used in accordance with embodiments of the invention. In an embodiment, molecular layers of 4-nitroazobenzene (NAB) and fluorene (FL) were electrochemically grafted to the PPF sidewall through reduction of their corresponding diazonium precursor at the PPF surface, resulting in a covalently bonded molecular layer. The thicknesses of the molecular layers may be measured for similar deposition conditions on a flat PPF surface using an AFM "scratching" technique, as the geometric limitations of the sidewall geometry prevent its direct measurement. In one embodiment, a comparison of the measured layer thickness and the theoretical calculated molecular length reveals that the NAB layer (4.5±0.7 nanometers) is a multilayer composed of 3-4 monolayers and the FL layer (1.7±0.2 nm) of 1-2 monolayers. In one embodiment, the multilayer is composed of covalently bonded and conjugated subunits, which form as a result of successive attacks on the previous monolayer by electrogenerated radicals. In an embodiment, diaminoalkane monolayers of 1,8-diaminooctane ($C_8$), 1,10-diaminodecane ($C_{10}$) and 1,12-diaminododecane ($C_{12}$) were attached to the PPF sidewall by means of electrochemical oxidation. Other embodiments may use other aliphatic molecules. Oxidation of primary amines on a carbon surface may form monolayers through radical-assisted C—N attachment at the interface. In one embodiment, the measured thickness of the $C_8$ layer is 1.1±0.2 nm, indicating monolayer formation. With respect to such end groups, in an embodiment, there are no constraints on the end group, since it is not being used to bond to a top contact. This factor may distinguish SDMD from conventional "break junctions," since gold may be "forced" onto the top of the molecules in SDMD, regardless of their end groups.

In an embodiment, with respect to molecular layer fabrication, for NAB and FL molecular layers, the corresponding diazonium salt is prepared from the precursors 4-4-nitrophenylazoaniline and 2-aminofluorene, respectively. In one embodiment, the molecular layers are attached to PPF through the electrochemical reduction of an approximately 1.0 mM solution of the corresponding diazonium salt in acetonitrile (MeCN) containing approximately 0.1 M n-tetrabutylammonium tetrafluoroborate (TBABF$_4$). For the NAB layer, in a specific embodiment, four cyclic voltammetric scans are performed from 0.4 to −0.6 V versus Ag/Ag$^+$ at 200 mV·s$^{-1}$. For the FL layer, in a specific embodiment, one scan is performed from 0.4 to −0.8 V vs Ag/Ag$^+$ at 200 mV·s$^{-1}$. Solutions may be thoroughly degassed with Ar and blanketed with Ar during electrochemical deposition. After surface modification, in an embodiment, the molecular layers were immediately rinsed in acetonitrile (MeCN) and dried in an Ar stream.

In an embodiment, the diaminoalkane monolayers are prepared from the precursors 1,8-diaminooctane, 1,10-diaminodecane, and 1,12-diaminododecane. In a specific embodiment, solutions of 1.0 mM diaminoalkane in MeCN containing 0.1 M TBABF$_4$ are stirred for approximately 1 hour and then filtered through an approximately 0.2 micron filter. In an embodiment, the monolayers are attached to the PPF through electrochemical oxidation at approximately 0.8 V vs Ag/Ag$^+$ for approximately 5 minutes. Solutions may then be degassed and blanketed with Ar during the oxidation process. The monolayers may also be rinsed with MeCN and dried in an Ar stream.

In an embodiment, thickness measurements of the molecular layer through atomic force microscopy or standard ellipsometry may not be directly performed because of the geometry of the PPF sidewall. Instead, thicknesses of the molecular layers are estimated from molecular layers attached to a flat PPF surface under the same deposition conditions as the sidewall junctions. An AFM scratching technique may be used to measure the molecular thickness.

In an embodiment, metallic contacts are deposited by electron-beam evaporation of Cu, Au, Pt, or Ag at a chamber pressure of approximately less than 2×10$^{-7}$ torr. For direct electron-beam evaporation on the molecular layers, in one embodiment, metal deposition occurs in a direction normal to the molecular surface, without shielding of the molecular layer from radiation from the evaporation source. In a specific embodiment, for SDMD, the deposition angle is varied between approximately 0° and 15° relative to the surface normal. With a deposition angle between 0° and 5°, the overhang of the Cr/SiO$_2$ etch mask may shadow the molecular layer from direct impingement of both incident metal atoms and radiation from the evaporation source. At 5°, in a particular embodiment, metal deposition occurs on the SiO$_2$ substrate approximately 10-500 nanometers, and in a particular embodiment 30-100 nanometers, laterally from the molecular layer bonded to the PPF sidewall.

In an embodiment, regarding metal contact deposition, for SDMD, Au, Cu, Pt, or Ag contacts are deposited in a Johnson Ultravac load-locked electron beam evaporation system. The base pressure of the evaporation chamber is approximately 5×10$^{-8}$ torr allowing deposition pressures less than approximately 2×10$^{-7}$ torr. Since surface diffusivity may depend on surface contaminants (e.g., O$_2$, H$_2$O), deposition pressure may affect the diffusion length and junction contact area. In one embodiment, an approximately 25 nanometer thick metallic contact is evaporated through a shadow mask aligned perpendicularly to the PPF lines with an evaporation rate of approximately 0.5 Å·s$^{-1}$, as measured by a quartz crystal monitor (QCM). The deposition angle relative to the surface normal of the substrate is, in one embodiment, varied between approximately 0-15 degrees.

In an embodiment, the Johnson Ultravac system includes a metal source-junction (throw) distance of approximately 45 centimeters and a metal source radius of approximately 8 millimeters. Since evaporation may not occur from a single point on the metal source, the deposition angles have a range of approximately ±0.5°. This angle range is sufficiently small to distinguish between deposition angles of 0°, 5°, and 15°. It should be noted that the electron beam size may be minimized during evaporation resulting in a melted source radius of approximately 2 millimeters.

For direct metal evaporation, in an embodiment, Au, Cu, or Pt contacts are deposited through a shadow mask in a K. J. Lesker PVD75 electron beam evaporation system. For metallic contacts, in one embodiment, approximately 10 nanometer thick films are deposited with a chamber pressure less than approximately 5×10$^{-6}$ torr at approximately 0.2 Å·s$^{-1}$. In one embodiment, for the Cu junctions, an additional approximately 15 nanometers of Au was deposited on top of the Cu contact to prevent oxidation of the Cu.

In an embodiment, in SDMD, electronic contact with a molecular layer occurs by surface diffusion of the deposited metal adatoms towards and eventually on top of the molecular layer. Incorporation of diffusing adatoms at the edge of the deposited metal film may cause the edge to migrate towards the molecular layer. Surface diffusion of adatoms may be characterized by the equations (1) and (2):

$$D_s = \lambda^2 v_s \exp\left(-\frac{\Delta G_s}{kT}\right) \tag{1}$$

and $$\bar{x} = 2\sqrt{D_s t}, \tag{2}$$

where λ is the hop distance, $V_s$ the hop frequency, $\Delta G_s$ is the activation energy, k is Boltzmann's constant, T is temperature, t is the diffusion time, and $\bar{x}$ is the average diffusion length. With a typical Au (or Cu) surface diffusion activation energy of between approximately 0.6 and 0.7 eV, the average diffusion length, in one embodiment, is approximately in the range of 50-350 nanometers at approximately 300 K for approximately 500 second deposition time, although surface heating caused by source radiation and metal condensation may lead to additional surface diffusion. Since metal deposition may occur approximately 10-500 nanometers (in a particular embodiment, 30-100 nanometers) from the molecular layer, the typical surface diffusion of Au adatoms is, in an embodiment, sufficient to allow the contact to become incident on the molecular layer.

In an embodiment, current densities are calculated using the measured metal diffusion distance onto the molecular layer, as observed by electron microscopy, where the diffusion length onto the molecular layer is dependent on the terminal group of the molecular layer, deposition parameters and diffusivity of the metallic contact. The diffusion length may be measured using back-scattered scanning electron microscopy (SEM) imaging of cross-sections of each type of molecular layer and metallic contact. Deposition of approximately 25 nanometers of Au, Cu and Pt at an angle of approximately 5° relative to the surface normal, in one embodiment, resulted in electronic contact with the molecular layer. In contrast, deposition of 25 nanometers of Cr, in one embodiment, resulted in junctions with open circuits, which may be a result of a lower surface diffusivity, most probably due to surface reactions.

In an embodiment, Raman spectroscopy is used to determine if structural damage occurs to a NAB molecular layer during direct Au deposition. Spectra may be measured on a flat PPF surface modified with a NAB molecular layer before and after deposition. In one embodiment, a spectrometer, which includes an Ar ion laser (514.5 nm), a 50 mm f/1.8 lens, a holographic reflection grating (2000 grooves/mm), and an Andor back-thinned charge-coupled device (CCD) detector cooled to −80° C., is used to acquire the spectra. In one embodiment, the incident laser power is approximately 19 mW with a spot diameter of approximately 17 microns. The integration time is approximately 30 seconds and the Raman shift is calibrated with naphthalene. Comparison of spectra obtained before and after direct evaporation of approximately 10 nanometers of Au, in an embodiment, confirms that observable changes in the Raman spectrum are absent during metal deposition. This result may provide evidence that the NAB molecular layer is not damaged during direct Au deposition. The decrease in Raman intensity after Au deposition may be caused by the partial transparency of the Au contact. Given the absence of apparent damage by Au deposition, the shorted devices resulting from direct Au deposition may be caused by Au penetration between molecular units or packing defects in the molecular layer.

In an embodiment, SEM images are taken with a Hitachi S-4800. Cross-sectional samples may be made by cleaving the Si/SiO$_2$ substrate across the molecular junction. Low acceleration voltages and beam currents (5 kV, 5 µA) may allow sufficient resolution while minimizing sample charging. Transmission electron microscopy (TEM) lamellae of the molecular junctions are, in one embodiment, milled with a Zeiss Nvision focused ion beam (FIB). Prior to milling, the molecular junctions may be coated with several micrometers of carbon to minimize sputtering and redeposition during the milling process. For the FIB process, approximately 30 keV Ga ions may be used to mill the lamellae to thicknesses below approximately 100 nanometers and approximately 5 keV gallium (Ga) ions were used for final polishing. In one embodiment, a JEOL JEM-2200FS TEM operating at approximately 200 kV is used to acquire bright field images and diffraction patterns. However, it may be the case that the molecular layer may not be resolved from the PPF surface.

In an embodiment, metal contacts for PPF/NAB/Au and PPF/NAB/Cr junctions are deposited using SDMD at approximately 5° relative to the surface normal. For the PPF/NAB/Au junction, in one embodiment, surface diffusion on the SiO$_2$ surface is sufficient to allow the Au to diffuse onto the PPF/NAB sidewall. For the PPF/NAB/Cr junction, in one embodiment, the deposited Cr layer does not reach the PPF/NAB sidewall. The shorter Cr diffusion length may be caused by a higher diffusion activation energy or parasitic interaction with surface contaminants (e.g., H$_2$O, O$_2$) on the SiO$_2$ substrate.

Figure 4A:
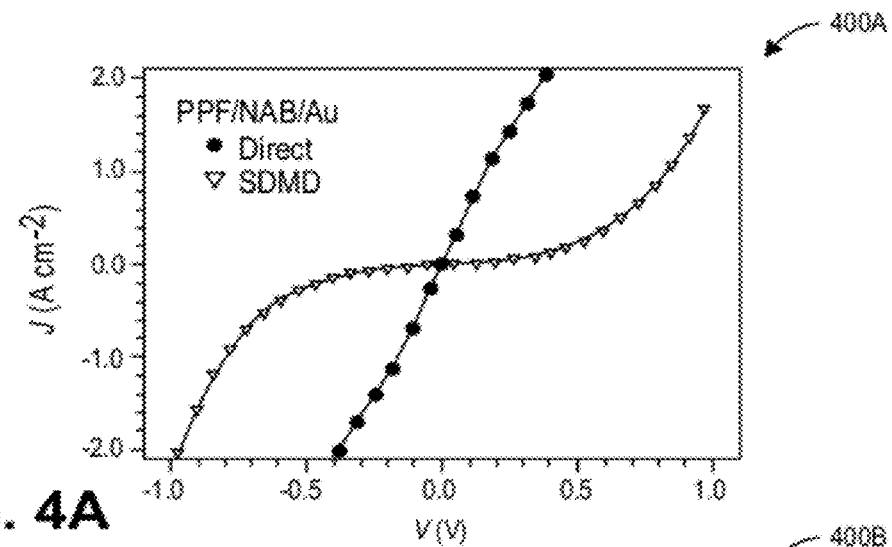
FIGS. 4A and 4B are plots of current density versus voltage (J-V plots) for direct evaporation (circles) and SDMD (triangles), in accordance with an embodiment of the present invention.
Figure 4B:
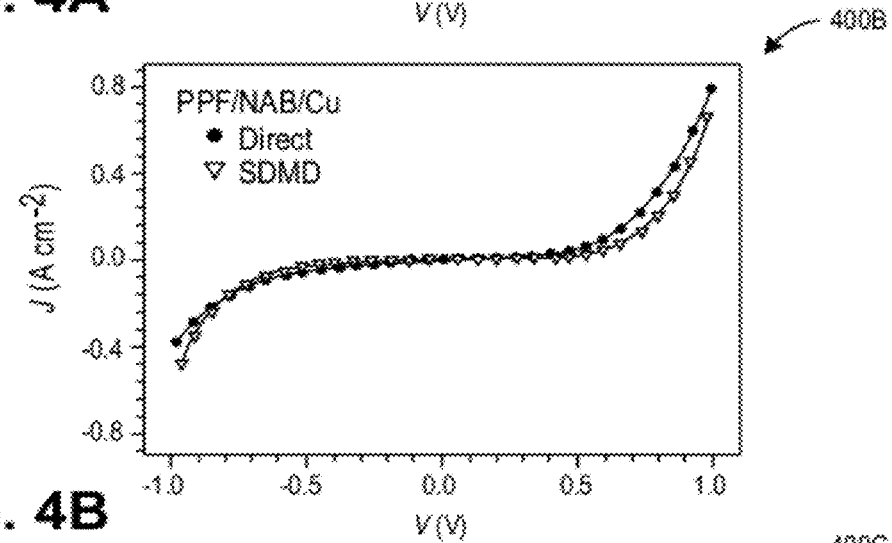
Figure 4C:
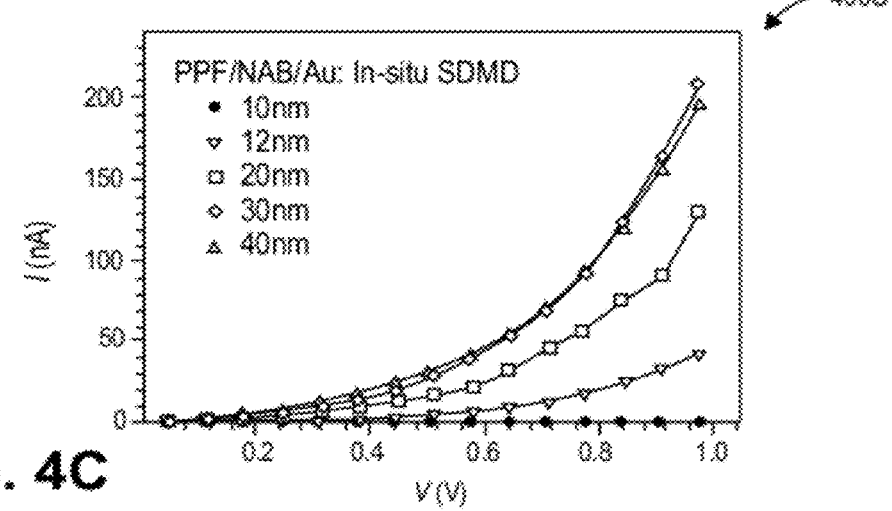
FIG. 4C is a plot of current versus voltage measured in situ for Au-contacted junctions made with SDMD with five different thicknesses of Au, in accordance with an embodiment of the present invention.
Figure 5A:
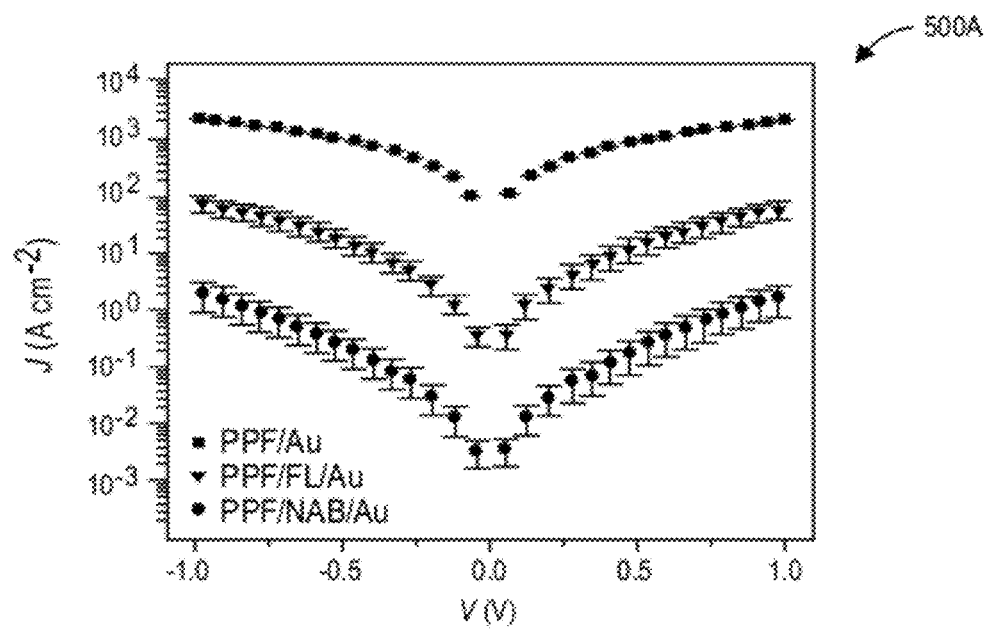
FIGS. 5A-5D are plots of J-V measurements for SDMD junctions with various molecular layers and top contacts, in accordance with an embodiment of the present invention.
Figure 5B:
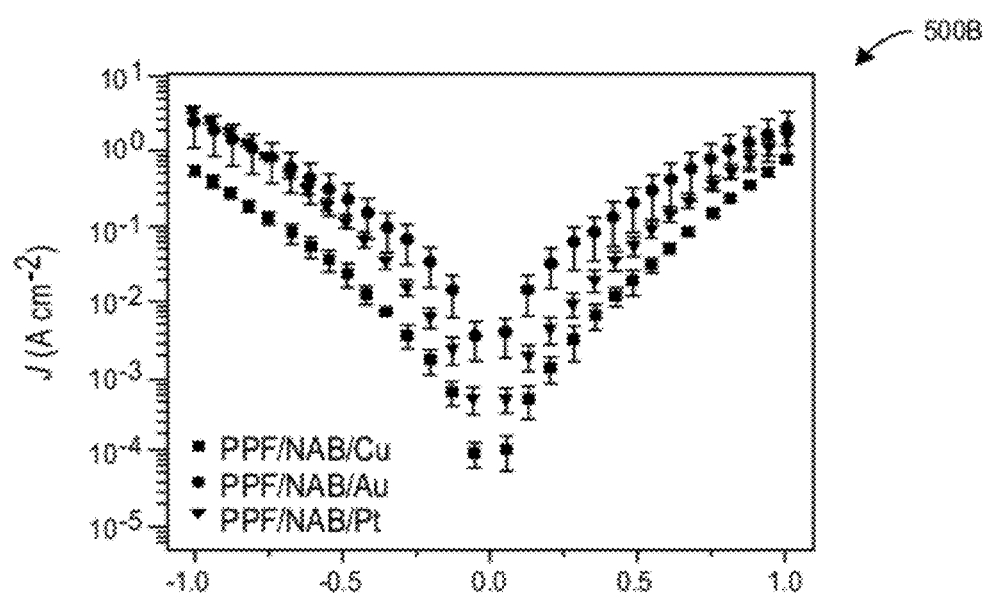
Figure 5C:
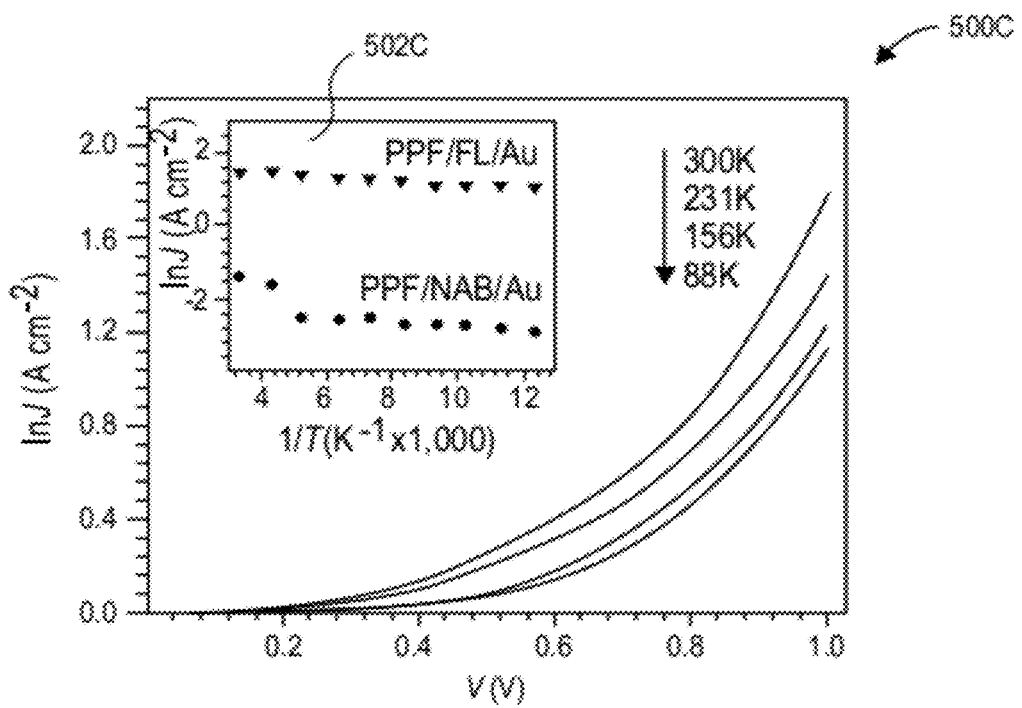
Figure 5D:
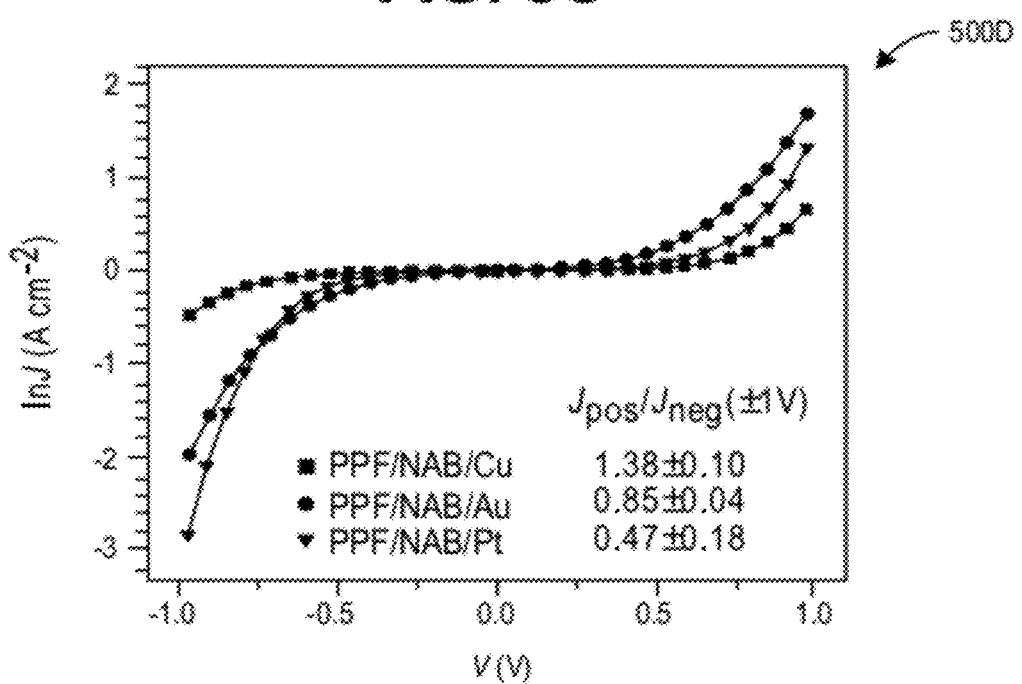
Figure 6:
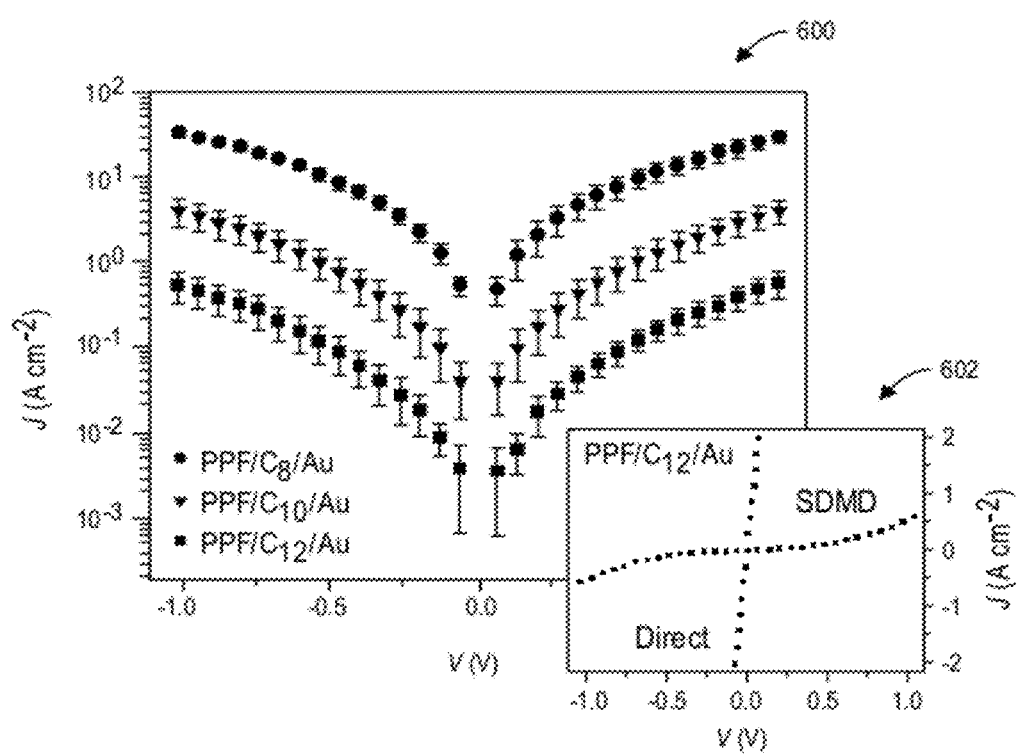
FIG. 6 is a plot of J-V measurements for diaminoalkane monolayer junctions, in accordance with an embodiment of the present invention.

In an embodiment, regarding electronic characterization, molecular junctions are characterized by means of current density-voltage (J-V) measurements under laboratory ambient conditions. For example, FIGS. 4A and 4B are plots 400A and 400B, respectively, of current density versus voltage for direct evaporation (circles) and SDMD (triangles), in accordance with an embodiment of the present invention. FIG. 4C is a plot 400C of current versus voltage measured in situ for Au-contacted junctions made with SDMD with five different thicknesses of Au, in accordance with an embodiment of the present invention. FIGS. 5A-5D are plots 500A, 500B, 500C, 500D, respectively, of J-V measurements for SDMD junctions with various molecular layers and top contacts, in accordance with an embodiment of the present invention. FIG. 6 is a plot 600 of J-V measurements for diaminoalkane monolayer junctions, in accordance with an embodiment of the present invention.

In general, referring to plots 400A and 400B, large differences between characteristics are observed for Au-contacted junctions made with the two techniques (A), and similar characteristics for Cu-contacted junctions (B). Referring to plot 400C, current is plotted instead of current density since the contact area increases with Au thickness until it reaches a maximum area at a thickness of about 30 nanometers (nm). For all measurements, positive bias indicates that the PPF is positive relative to the metal contact. Referring to plots 500A-500D, J-V measurements for SDMD junctions with various molecular layers and top contacts are included. 500A includes plots of current density (on a logarithmic scale) versus voltage for gold contacts with (triangles and circles) and without (squares) a molecular layer. The current density is strongly reduced by the presence of a FL (triangles) or NAB (circles) molecular layer. 500B plots current density (on a logarithmic scale) versus voltage for Cu (squares), Au (circles) and Pt (triangles) contacts on NAB junctions resulting in similar responses, with current densities ranging over an order of magnitude. Error bars in 500A and 500B represent the standard deviation for a minimum of five junctions on one test chip. 500C includes plots of current density versus voltage for PPF/NAB/Au at four different temperatures. The inset plot 502C includes Arrhenius plots of the logarithm of the current density at 0.5 V versus the inverse of temperature (between 80 and 300 K) for PPF/NAB/Au (circles) and PPF/FL/Au (triangles) junctions. The current density shows a minimal dependence on temperature in this range. 500D plots the J-V measurements, which shows that the asymmetry becomes more obvious when the current density is plotted with a linear y-axis, as can be seen when the data from 500B are replotted. The inset in 500D shows the measured asymmetry ratio at ±1 V. Referring to plot 600, current density (on a logarithmic scale) versus voltage is plotted for $C_8$ (circles), $C_{10}$ (triangles), and $C_{12}$ (squares) junctions with Au top contacts made using the SDMD technique. Error bars represent the standard deviation for a minimum of five junctions on one test chip. The inset 602 includes a plot of current density (on a linear scale) versus voltage for PPF/$C_{12}$/Au junctions made using direct and SDMD evaporation.

More specifically, for PPF/NAB/Au junctions (plot 400A), J-V curves for direct evaporation and SDMD show significant differences in shape and current density. Direct evaporation of Au may result in a high current density and the nearly linear J-V response characteristic of an electronic short between the PPF and Au. Raman spectroscopy of the NAB layer before and after direct Au deposition shows no apparent structural changes, suggesting that the shorted junctions are caused by Au penetration. In contrast, Au junctions fabricated with SDMD exhibit a nonlinear J-V response similar to conductor/molecule/metal junctions made with indirect metal deposition. Comparable differences between direct evaporation and SDMD are observed for junctions containing FL layers and junctions with a Pt contact.

Deposition of Cu contacts results in similar J-V responses for both deposition methods (plot 400B). Highly reproducible molecular junctions may be fabricated by direct evaporation of Cu without the presence of observable metal penetration into the molecular layer, yielding J-V characteristics with the same shape and magnitude as those obtained with SDMD. Although expected, the overlap in the J-V curves for direct and SDMD PPF/NAB/Cu junctions shows that two distinctly different deposition techniques may result in junctions with similar electronic behavior. Furthermore, these results show that Au and Pt penetration into the molecular layer may, in an embodiment, be minimized with SDMD.

Plots 500A and 500B include J-V curves plotted on a log scale for various junctions, with the standard deviations indicated for at least five different junctions prepared simultaneously. The large decrease in current density with the incorporation of a molecular layer between the PPF and metallic contacts may indicate that the current is dominated by charge transport through the molecular layer. A comparison of various molecular layers shows that the J-V characteristics may depend strongly on the thickness and structure of the molecular layer.

Plot 500B compares the J-V responses for PPF/NAB with Cu, Au and Pt top contacts, a comparison that cannot be achieved through direct evaporation alone due to Au and Pt penetration. The observed trend in current asymmetry ($J_{pos}/J_{neg}$) may be consistent with charge transport through the highest occupied molecular orbital (HOMO) of the molecular layer. In an embodiment, as the work function of a contact increases, the barrier between the HOMO and the Fermi energy of the contact decreases, allowing more efficient transport through the HOMO. The work function of the PPF contact is approximately 4.93 eV, and that of electron-beam deposited Cu is approximately 4.73 eV, as determined with a Kelvin probe. For PPF/NAB/Cu junctions, the lowest barrier for hole conduction may be between the PPF and HOMO, resulting in a higher current when the PPF is biased positively. For PPF/NAB/Pt junctions, the lowest barrier may be between the HOMO and Pt, resulting in a higher current when the PPF is biased negatively (Pt biased positively). Although the above model may be consistent with the observed asymmetry, unequivocally determining the dominant charge carrier is complicated by the unknown nature of energy level alignment within a molecular layer.

Other considerations, although not all inclusive, that may need to be taken into account are the effect of interfacial dipoles and molecular energy level broadening. In an embodiment, varying the work function of the second contact by approximately 0.7 eV (for Cu to Pt) results in a current-density change of less than an order of magnitude, which is similar to that observed for the contact resistance of alkanedithiols. The current for off-resonant tunneling is not expected to depend strongly on the work function of the contacts, as observed in plot 500D. However, for molecules not yet studied which have molecular orbital energies close to the contact Fermi energy, significant deviations from off-resonant tunneling models are expected. Most tunneling models assume that all of the applied voltage appears across the molecular layer, neglecting the possible effects associated with a voltage drop at the contact/molecule interface. In an embodiment, a more complete understanding of energy level alignment within a molecular layer may be needed to fully understand the effect of work function on current density.

In an embodiment, in situ current-voltage (I-V) curves are measured for an SDMD-fabricated PPF/NAB/Au junction during Au deposition by means of an electrical pass-through in the evaporation chamber. As shown in plot 400C, the onset of current occurred between Au depositions of 10 and 12 nm (mass thickness). The invariant shape of the I-V measurements with Au deposition indicates consistent contact formation at the NAB/Au interface. With approximately 30 nanometers of deposited Au, the increase in current levels off, indicating the junction is approaching a constant contact area. In situ current measurements during gradual SDMD may allow the stepwise formation of molecular junctions from the initial contact of a single molecule to a larger area having an ensemble of molecules. Such measurements may be useful in the determination of the onset of current (minimum deposition needed) and when deposition may be stopped (maximum deposition beyond which current does not increase).

In an embodiment, low-temperature J-V curves for SDMD junctions are measured in a cryogenic probe station evacuated to approximately $5\times10^{-6}$ torr (plot 500C). For the temperature range 81-188 K, the measured activation energies for the NAB/Au and FL/Au junctions are less than approximately 0.003 eV, substantially less than expected for activated charge transport mechanisms such as redox exchange or molecular conformation changes. The small activation barrier may originate outside the junction, because correction of lead or contact resistance of the metal contact may not readily be achieved with SDMD junctions.

In an embodiment, the J-V characteristics of PPF/diaminoalkane/Au junctions fabricated by SDMD are shown in FIG. 6. Direct Au evaporation on diaminoalkane monolayers results in electronic shorts, demonstrating the "soft" nature of the SDMD technique (inset of FIG. 6). In one embodiment, for $C_8$, $C_{10}$ and $C_{12}$ junctions, charge transport is consistent with off-resonance tunneling, where the current density decreases exponentially with molecular length (N) according to $J \propto \exp(-\beta N)$. The observed decay constant $\beta$ is approximately 1.1 per carbon atom (0.88 Å$^{-1}$), providing strong evidence that the measured current may propagate through the molecular layer and may not be associated with transport through pin holes or metal filaments. In an embodiment, the current densities of FL (1.7±0.2 nm) and $C_{12}$ (1.6±0.2 nm) junctions differ by two orders of magnitude, indicating that conjugation within the molecular layer strongly affects charge transport. Compared to $C_{12}$, the conjugated FL layer may have molecular energy levels closer to the Fermi energy of the contacts, resulting in higher conductance.

In an embodiment, regarding the surface diffusion mechanism, thin-film deposition processes can be separated into two phases: the accommodation and diffusion periods. During the accommodation period, kinetic energy perpendicular to the surface is transferred into the parallel direction and surface heat within a few atomic jump distances. After the accommodation period, the adatoms are in equilibrium with the film surface and undergo surface diffusion. Surface diffusion continues until the metal adatom is trapped by chemisorption (e.g., surface kink, reactive functional group) or is buried by newly arriving metal atoms.

In an embodiment, for direct evaporation, penetration of metal atoms into the molecular layer can occur during both the accommodation and diffusion periods on the molecular layer. The degree of penetration may depend on the kinetic energy of the incident metal atoms, chemical interactions or heat of condensation. As an example, a reduction in the kinetic energy of incident Au atoms may decrease the tendency for metal penetration into a molecular layer. Direct evaporation of Cu on chemisorbed molecular layers may be performed without observable penetration, in contrast to the case for Au contacts. The high tendency for Au penetration when compared to Cu may be due to differences in surface energy, reactivity with surface functional groups or the lower heat of vaporization of Cu. The higher oxidation affinity of Cu compared to Au or Pt may result in Cu oxidation during deposition, thus reducing the tendency for Cu penetration, although X-ray photoelectron spectroscopy depth profiling may show no detectable oxygen at the carbon/Cu interface in PPF/Cu devices. In one embodiment, the SDMD technique results in non-shorted junctions for Cu, Au and Pt. This may imply a fundamentally different deposition mechanism from direct evaporation.

In an embodiment, for SDMD, direct impingement of metal atoms on the molecular layer is prohibited by an overhanging SiO$_2$ layer. As a result, the accommodation period occurs away from the molecular layer, thus remotely dissipating the kinetic energy and heat of condensation. Surface diffusion of the metal adatoms towards the molecular layer during the evaporation process may cause the leading edge of the metal layer to migrate towards and finally become incident on the molecular layer. When a diffusing adatom arrives at the leading edge of the metal film, the adatom may be coordinated by several other adatoms (e.g., three for a single layer of {111} Au). For the adatom to dissociate from the metal edge and diffuse onto the surface or into the interior of the molecular layer, the adatom may need to overcome the binding energy associated with its coordination. Using effective medium theory, the binding energy (E$_b$) of a face-centered cubic (fcc) metal as a function of coordination number follows equation (3):

$$E_b(C) = E_c \left(\frac{C}{12}\right)^{0.3}, \qquad (3)$$

where C is the coordination number and E, is the cohesive energy of Au (3.81 eV) or Cu (3.49 eV). For example, an Au atom coordinated with two Au atoms has a binding energy of approximately 2.2 eV. This binding energy may provide an energetic barrier that prevents a diffusing adatom from dissociating and diffusing into the molecular layer. Since the activation energy for surface diffusion may be lower than the binding energy, an influx of metal adatoms by means of surface diffusion may occur at energies significantly below the binding energy.

In accordance with an embodiment of the present invention, in contrast to direct evaporation, adatoms incident on the molecular layer are coordinated during the entire SDMD process, providing a constant barrier to metal penetration. Since this barrier is larger than any anticipated attraction between the molecular layer interior and the dissociated metal atom, significant penetration and filament formation is prevented.

Figure 7A:
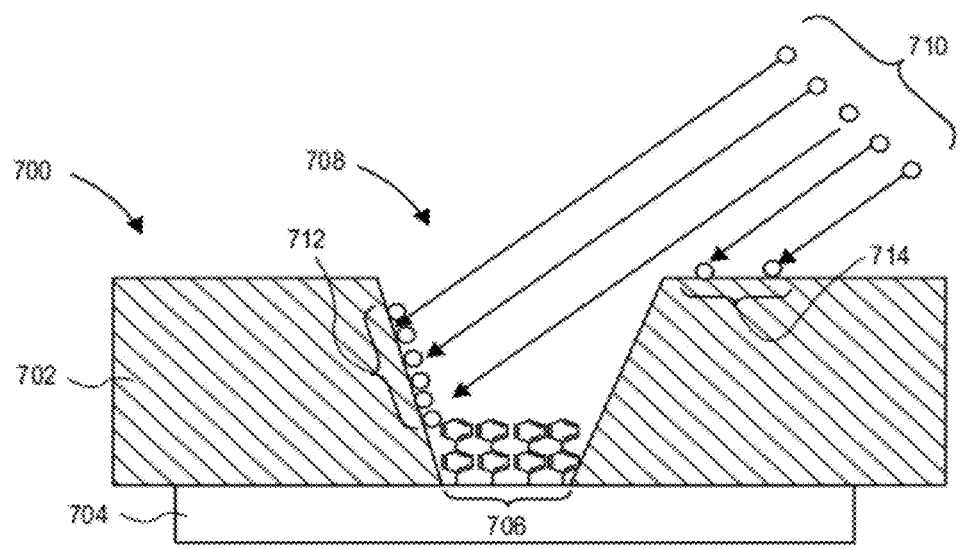
FIGS. 7A-7B illustrate cross-sectional views representing operations in another method of fabricating a metal contact for a molecular device junction by SDMD, in accordance with an embodiment of the present invention.
Figure 7B:
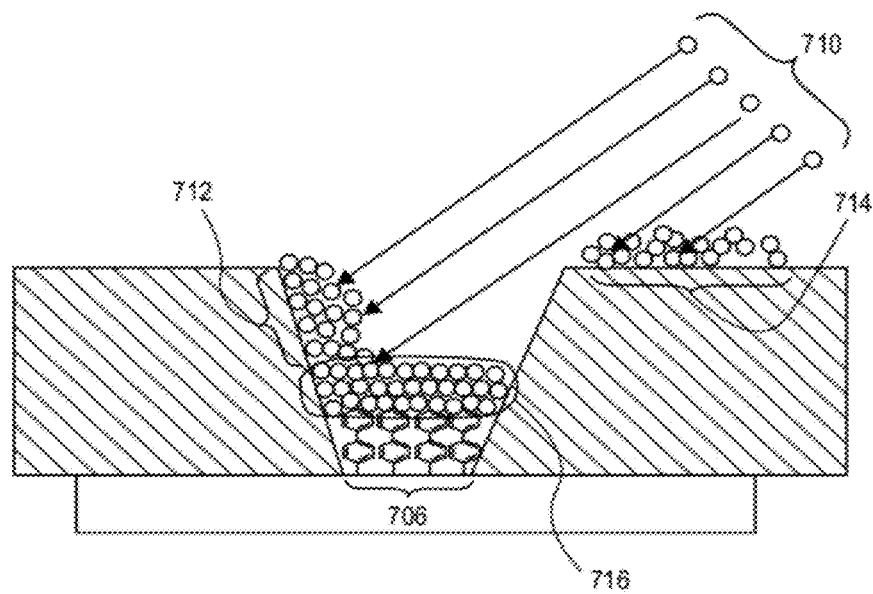

FIGS. 7A-7B illustrate cross-sectional views representing operations in another method of fabricating a metal contact for a molecular device junction by SDMD, in accordance with an embodiment of the present invention.

Referring to FIG. 7A, a structure 700 is provided including a layer 702, which may include a resist (such as a positive or negative photoresist), a polymer (such as polymethylmethacrylate or polystyrene), SiO$_2$, or another suitable material, disposed above a substrate 704, which may have a PPF or dielectric layer disposed thereon. A molecular layer 706 is disposed along the bottom of a trench 708 formed in layer 702, along an exposed portion of the substrate 704. An atom beam 710 deposits metal atoms on structure 700. A region 712 of metal atoms is formed along the sidewalls of the trench 708, proximate to, but separate from, the molecular layer 706. Additional regions of metal atoms may also be formed, such as region 714, so long as they are not deposited directly on the molecular layer 706, as depicted in FIG. 7A. The portion of layer 702 upon where the metal atoms deposit on region 714 shadow the molecular layer from direct metal deposition.

Referring to FIG. 7B, as the deposition of metal atoms from atom beam 710 continues, a region 716 of metal atoms forms on molecular layer 706 by an SDMD process. Additionally, region 712 continues to receive deposited metal atoms. The process depicted in FIGS. 7A and 7B may provide a simplified and more general fabrication process using SDMD. For example, in one embodiment, the sidewalls of the trench 708 are made lithographically by a variety of processes. It is noted that even though metal atoms continue to build up and are eventually deposited directly on region 716, in an embodiment, the atom beam 710 does not deliver metal atoms directly to the molecular layer 706 at any point in the process. For example, deposition of metal atoms as a beam at an angle relative to the surface prevents direct exposure of the molecules to the metal beam. The metal atoms deposit on the sidewall 712, and only then diffuse onto the molecular layer 706 or previously formed portion of the metal contact 716. In this way, initial migration provides a protective layer to dissipate the heat of subsequently deposited metal atoms.

In another embodiment, prior to formation of molecular layer 706, the sidewalls of trench 708 formed in SiO$_2$ layer 702 are modified with a silane to accelerate diffusion by SDMD. In an alternative embodiment, prior to formation of molecular layer 706, the sidewalls of trench 708 formed in SiO$_2$ layer 702 are modified with a silane to accelerate or decelerate diffusion by SDMD, depending on the identity of the silane reagent. In a specific embodiment, the molecular layer 706 has a thickness approximately in the range of 1-5 nanometers. In another specific embodiment, layer 702 has a thickness approximately in the range of 50-100 nanometers.

Figure 8A:
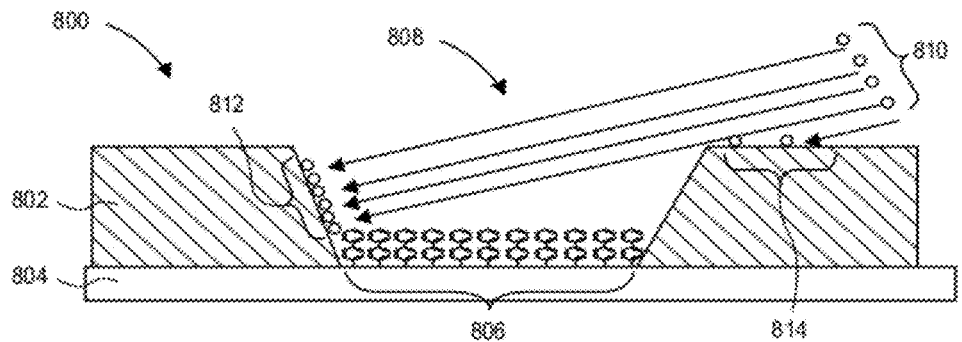
FIGS. 8A-8C illustrate cross-sectional views representing operations in another method of fabricating a metal contact for a molecular device junction by SDMD, in accordance with an embodiment of the present invention.
Figure 8B:
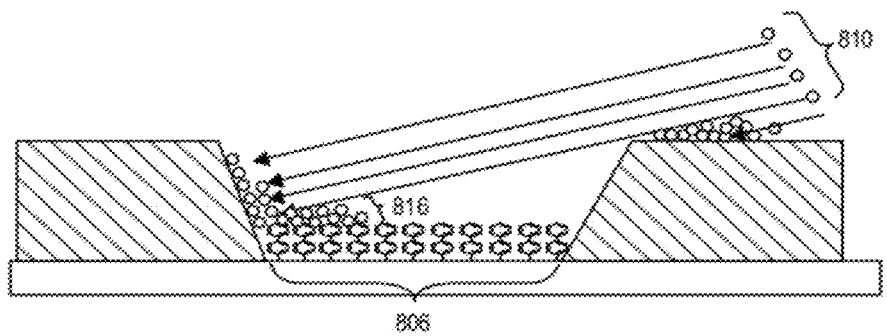
Figure 8C:
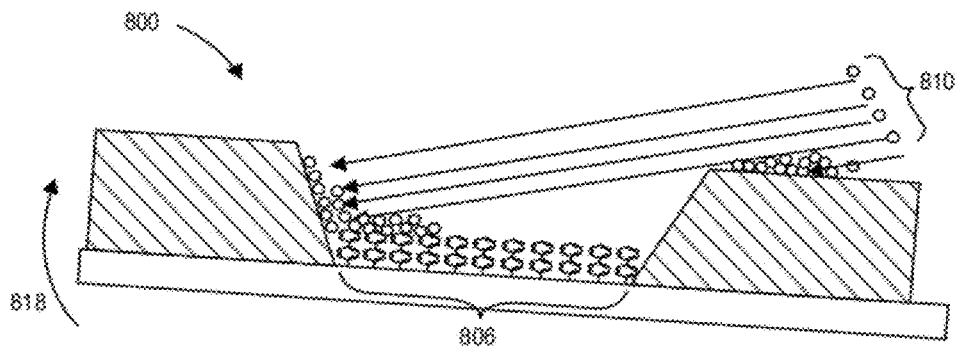

FIGS. 8A-8C illustrate cross-sectional views representing operations in another method of fabricating a metal contact for a molecular device junction by SDMD, in accordance with an embodiment of the present invention.

Referring to FIG. 8A, a structure 800 is provided including a layer 802, which may include a resist, polymer, SiO$_2$, or another suitable material, disposed above a substrate 804. A molecular layer 806 is disposed along the bottom of a trench 808 formed in layer 802, along an exposed portion of the substrate 804. An atom beam 810 deposits metal atoms on structure 800. A region 812 of metal atoms is formed along the sidewalls of the trench 808, proximate to, but separate from, the molecular layer 806. Additional regions of metal atoms may also be formed, such as region 814, so long as they are not deposited directly on the molecular layer 806, as depicted in FIG. 8A. The portion of layer 802 where upon the metal atoms deposit on region 814 shadow the molecular layer from direct metal deposition. As compared to structure 700 of FIG. 7A, the trench 808 of structure 800 is wider than the diffusion length of the deposited metal.

Referring to FIG. 8B, as the deposition of metal atoms from atom beam 810 continues, a region 816 of metal atoms forms on molecular layer 806 by an SDMD process, as described in association with FIG. 7B. However, different from the process of FIGS. 7A and 7B, referring to FIG. 8C, structure 800 is rotated in the direction 818. In this way, metal atoms from atom beam 810 still impinge onto previously deposited metal and not directly onto molecules, but the diffusion front will move across the molecular layer 806 as the sample is slowly rotated.

Thus, in an embodiment, again in the context of FIGS. 8A-8C, slow rotation of the substrate during deposition permits a larger area of molecules to be covered. Starting at the initial angle shown in FIG. 8A, deposition occurs with metal diffusion onto the molecular layer. The distance the metal diffuses is finite, and will stop at some point if the deposition angle is constant (e.g., FIG. 8B). If the sample is then rotated (e.g., clockwise in FIG. 8C), the metal will diffuse farther onto the molecular layer. Newly arriving metal atoms deposit onto metal, and all metal reaching the molecular layer does so by diffusion. The area of the sample which may be covered by slow rotation is much larger than the finite diffusion length of the metal, and larger than the area possible with the fixed deposition angle shown in FIG. 8A.

In other embodiments, other movements, including rotations and translations, of the substrate may facilitate movement of the diffusion front. For example, the structure 700 or 800 may be rotated or translated in other directions. In a specific embodiment, the structure 700 or 800 may be rotated an azimuthal angle in the plane of the substrate's original orientation with an axis normal to the substrate's original orientation, such that the diffusion front moves across a larger area of the molecular layer. In another embodiment, the structure 800 can be rotated in the plane of its tilted orientation with an axis normal to its tilted orientation. In another embodiment, the structure in FIG. 2H may be rotated or translated to allow the newly deposited metal atoms to arrive on previously formed portions of the metal contact on the molecular layer. In one or more such embodiments, "hot" metal atoms never touch the molecular layer but are deposited onto another structure or onto previously formed portions of the metal contact on the molecular layer.

In accordance with an embodiment of the present invention, high resolution (HR) imaging and nano-beam diffraction (NBD) analysis of molecular devices is used to characterize the morphology and structure of the interface between the molecular layer and the contact electrode formed by SDMD. High resolution TEM (HRTEM) imaging may be a direct way to view the morphology of an interface and to measure projected interface roughness. Electron diffraction analysis may provide data that allow identifying the structure and orientation of crystalline materials. Nano-beam diffraction (NBD) may allow local structure and orientation to be determined with a probe size of a few nanometers in diameter. In an embodiment, characterization of a molecular device composed of a molecular layer attached to metallic electrodes is performed. In an embodiment, combining HRTEM and NBD analysis provides a complete morphological and crystallographic structure analysis of metal-molecule interfaces. For example, multilayer (Au-molecule-Si) devices were prepared by grafting 4-nitroazobenzene (NAB) molecules onto p-doped silicon followed by deposition of an Au film in an electron beam evaporator.

Figure 9:
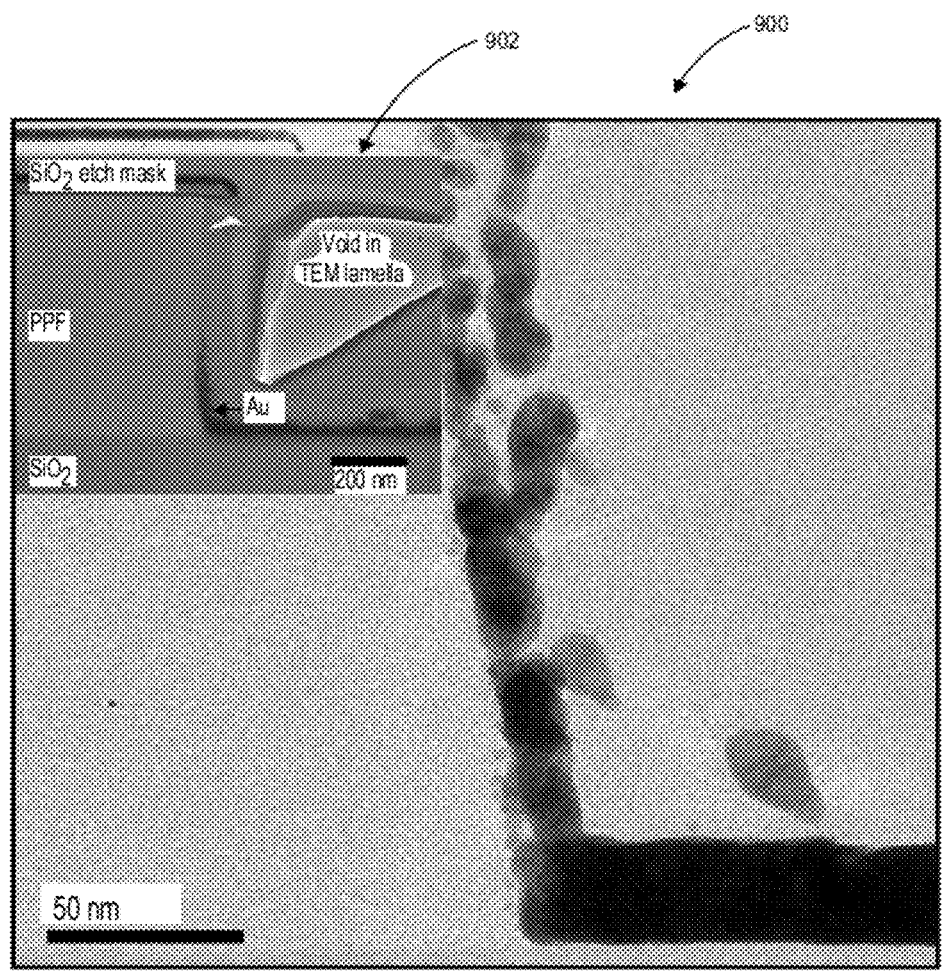
FIG. 9 is a cross-sectional transmission electron microscope (TEM) image of a sidewall junction, showing a non-continuous gold (Au) films on the sidewall. The inset image is a TEM image of an entire sidewall cross-section of a different sample, showing a continuous gold film, in accordance with an embodiment of the present invention.

FIG. 9 is a cross-sectional transmission electron microscope (TEM) image 900 of a sidewall junction, showing a non-continuous gold (Au) film on the sidewall, with an inset image 902 of the entire sidewall cross-section, in accordance with an embodiment of the present invention. Referring to FIG. 9, surface-diffusion-mediated deposition forms Au on the PPF/NAB sidewall, which has a different morphology from the Au film deposited on the horizontal $SiO_2$ surface. The discontinuous nature of the gold film in 900 may be an artifact of the TEM lamella preparation. The heat generated in the preparation may have resulted in the annealing of gold to form particles. A NAB molecular layer is not resolved here due to very weak contrast between PPF and the NAB molecular layer. Preferential orientation of Au may not be found for the SDMD-deposited Au. Referring to inset image 902, a continuous gold film is formed on the sidewall, showing that SDMD may be suitable in forming continuous metallic contacts on molecular layers.

Thus, in accordance with an embodiment of the present invention, SDMD is used to form a metal contact for a molecular device junction. In one such embodiment, direct impingement of atoms used in forming an electronic contact is prevented on the surface of interest (e.g., the surface of interest may be amorphous carbon with attached molecular layers). In a specific such embodiment, impingement of incident atoms occurs away from the surface of interest but within the diffusion length of adatoms constituting the electronic contact (e.g., approximately in the range of tens to hundreds of nanometers). In an embodiment, the metal atoms are provided by a technique such as, but not limited to, metal beam deposition, evaporation, physical vapor deposition, chemical vapor deposition, chemical solution deposition, or electroplating. In an alternative embodiment, the metal atoms are formed by a "write" process from a beam of metal atoms/ions onto a nearby surface, then the resulting metal atoms are diffused onto the molecules. Although such a process may be slower since it is "serial," a beam with a well-defined pattern may be suitable for a larger area. In an embodiment, the metal is deposited by a metal beam without a direct shield, such as an overhang or trench, to the molecular layer. In a particular embodiment, collimation of the depositing beam is used as a non-shielding approach for metal deposition. The diffusion kinetics and surface thermodynamics associated with various deposition approaches may vary, which may increase or decrease the spatial resolution of the deposition technique.

In an embodiment, the region of metal atoms is formed without a shielding structure affixed to the substrate. For example, in one embodiment, the metal is deposited by a metal beam without the use of a direct shield, such as an overhang or trench, to protect the molecular layer. In a particular embodiment, collimation of the depositing beam is used as a non-shielding approach for metal deposition. In an embodiment, a shadow mask is aligned to deposit the metal atoms in only the desired regions from where the metal atoms will diffuse onto the molecular layer. The openings in the mask may collimate the metal beam to increase the resolution of the deposition, i.e., the minimum feature size that can be created has to be smaller than the diffusion length of the metal atoms. In another embodiment, a focused ion beam (FIB) is used to induce deposition by decomposing a precursor gas into metal and volatile reaction products. In another embodiment, a focused ion beam is used to perform directed deposition of the desired metal to form the region. The resulting region is a source of metal atoms for diffusing onto the molecular layer.

In an embodiment, SDMD is a reliable method with which to fabricate metallic second contacts on covalently attached molecular layers. For the case of a Cu top contact, in one embodiment, the SDMD current-voltage response agrees quantitatively with those from direct Cu deposition, but Au and Pt deposition was successful only with the SDMD technique. In one embodiment, electronic and spectroscopic characterization of junctions fabricated with direct Au or Pt evaporation is consistent with filament formation caused by metal penetration. By contrast, in one embodiment, the SDMD technique prevents observable metal penetration, resulting in robust molecular junctions with all three metals. Penetration of incident metal atoms may be prevented by ensuring the presence of metal-metal bonds at the molecule/metal interface. For SDMD, in an embodiment, the influx of adatoms is controlled through surface diffusion, ensuring continuous metal-metal bonding as the metallic contact forms on the molecular layer. The ability to vary the work function of the second contact may provide a crucial experimental tool, allowing insight into charge transport in molecular junctions. In addition, in situ monitoring of the SDMD process may allow characterization of the stepwise junction progression from initial contact of only one molecule to larger junctions having many molecules in parallel between PPF and the top metal contact. The SDMD technique may be applicable to a wide range of additional molecular and organic systems.

In an embodiment, SDMD uses a substrate configuration which protects the soft organic molecules or layers from direct deposition by a beam of metal atoms. In one such embodiment, metal atoms impinge on the substrate approximately in the range of 10-500 nanometers away from the molecules, where they dissipate their kinetic energy and heat of condensation. The angle of the sample relative to the metal atom beam may be varied to alter the distance between the molecules and the metal impact point. Many metals, including Au, Pt, Cu, and Ag, are mobile at room temperature, and may diffuse toward the molecules.

In an embodiment, surface diffusion proceeds until the metal makes contact with the molecules, permitting contacts to form with single molecules, or a collection of many molecules in parallel. Diffusion may continue on the molecular layer to cover a possibly large area incorporating >$10^6$ molecules. The "molecular" layer may be composed of an organic film, molecular monolayers, carbon nanotubes, etc., and the substrate (e.g., a pyrolyzed photoresist film, PPF) may be a variety of materials, including metals, semiconductors, or insulators. In one embodiment, penetration of metal into the organic layer is prevented by the binding energy between metal atoms (typically 2-3 eV), which must be overcome by heat or an attractive force if a metal atom is to break away from the diffusing front and penetrate into the molecular layer.

Many industrial processes involve vapor deposition of conducting materials, usually metals, to make microelectronic circuits, optical components, vapor barriers, etc. The substrates onto which metal is deposited are typically limited to materials which are tolerant of metal atoms which contain significant kinetic and thermal energy (e.g., the heat of condensation). Soft materials such as organic and biological molecules, organic semiconductors, and molecular monolayers are more easily damaged than inorganic semiconductors, and it is often difficult to deposit metallic contacts without significant damage to or metal penetration through these soft materials. In accordance with an embodiment of the present invention, with SDMD, the metal atoms make contact with the soft material approximately at room temperature, after the heat of condensation and kinetic energy have been dissipated at a distance away from the soft material. Thus the energy imparted to the soft material may be minimal, and the possibility of metal penetration may be prevented by metal-metal bonds.

In an embodiment, applications of the SDMD process described herein include, but are not limited to, fabrication of organic, or "plastic," electronics which require metal contacts on organic molecules and/or semiconductors (e.g., radio-frequency identification (RFID) tags, organic light emitting diodes, organic thin-film transistors, low-cost, low-power battlefield electronics), metal deposition on polymers for electronic and optical purposes (e.g., multilayer optical filters, plasmonic structures), and applications involving an interface or connection between chemical or biochemical recognition sites and electronic circuits (e.g., medical diagnostic devices or devices to detect chemical or biological weapons). The chemical recognition element is typically soft and fragile compared to silicon and other inorganic semiconductors, so SDMD may provide a method for establishing such connections. In one embodiment, SDMD represents the most gentle method conceivable for establishing direct contact between biomolecules and clean, "cold" metal atoms. In terms of time scale, implementation of SDMD in a manufacturing line may require only straightforward modification to commonly used equipment, namely deposition onto a patterned substrate at a predetermined incidence angle of metal atoms. In an embodiment, where soft deposition is otherwise required for a particular application, the SDMD method is implemented quickly, since no specialized equipment is required.

Thus, metal contact formation for molecular device junctions by SDMD has been disclosed. In accordance with an embodiment of the present invention, a method of fabricating a molecular device junction by surface-diffusion-mediated deposition (SDMD) includes forming a molecular layer above a first region of a substrate. A region of metal atoms is then formed above a second region of the substrate proximate to, but separate from, the first region. A metal contact is then formed by migrating metal atoms from the region of metal atoms onto the molecular layer.

What is claimed is:

1. A method of fabricating a molecular device junction by surface-diffusion-mediated deposition (SDMD), the method comprising:
    forming a molecular layer above a first region of a substrate;
    forming a region of metal atoms above a second region of the substrate proximate to, but separate from, the first region of the substrate; and
    forming a metal contact by migrating metal atoms from the region of metal atoms onto the molecular layer.

2. The method of claim 1, wherein forming the region of metal atoms comprises forming the region of metal atoms with a separation from the molecular layer approximately in the range of 10-500 nanometers.

3. The method of claim 1, wherein the region of metal atoms is formed above a silicon dioxide layer treated with a silane to accelerate or decelerate the migration of the metal atoms.

4. The method of claim 1, wherein forming the molecular layer comprises forming a layer of aromatic molecules with a thickness approximately in the range of 1-100 nanometers.

5. The method of claim 1, wherein forming the molecular layer comprises forming the molecular layer adjacent to a sidewall of a pyrolyzed photoresist film (PPF) formed above the substrate.

6. The method of claim 1, wherein forming the molecular layer comprises forming the molecular layer underneath an overhang region of a mask layer formed above the substrate.

7. The method of claim 1, wherein forming the molecular layer comprises forming the molecular layer at the bottom of a trench in a film formed above the substrate.

8. The method of claim 7, wherein forming the molecular layer at the bottom of the trench in the film comprises forming the molecular layer above a PPF exposed by the trench, and wherein the film comprises a layer of silicon dioxide, resist, or polymer.

9. The method of claim 1, wherein the region of metal atoms is formed without a shielding structure affixed to the substrate.

10. The method of claim 1, wherein forming the region of metal atoms comprises using a technique selected from the group consisting of metal beam deposition, evaporation, physical vapor deposition, chemical vapor deposition, chemical solution deposition, and electroplating.

11. The method of claim 1, wherein the region of metal atoms comprises atoms selected from the group consisting of gold (Au), copper (Cu), platinum (Pt), and silver (Ag).

12. The method of claim 1, wherein the substrate is rotated around, or translated along, one or more axes during the forming of the region of metal atoms.

13. The method of claim 1, wherein forming the metal contact comprises, after the metal contact forming has begun, continuing forming of the metal contact by depositing metal atoms on the portions of the metal contact that have already formed on the molecular layer.

14. A method of fabricating a molecular device junction by surface-diffusion-mediated deposition (SDMD), the method comprising:

forming a pyrolyzed photoresist film (PPF) above a substrate;

forming a molecular layer on the PPF;

forming a region of metal atoms above the substrate proximate to, but separate from, the molecular layer; and forming a metal contact by migrating metal atoms from the region of metal atoms onto the molecular layer.

15. The method of claim 14, wherein forming the region of metal atoms above the substrate comprises forming the region of metal atoms with a separation from the molecular layer approximately in the range of 10-500 nanometers.

16. The method of claim 14, wherein forming the molecular layer comprises forming a layer of 4-nitroazobenzene (NAB) or fluorene (FL) with a thickness approximately in the range of 1-5 nanometers.

17. The method of claim 14, wherein forming the molecular layer comprises forming the molecular layer adjacent to a sidewall of a pyrolyzed photoresist film (PPF) formed above the substrate and underneath an overhang region of a mask layer formed above the PPF.

18. The method of claim 14, wherein forming the molecular layer comprises forming the molecular layer at the bottom of a trench in a film formed above the PPF, and wherein the film comprises a layer of silicon dioxide, resist, or polymer.

19. A method of fabricating a molecular device junction by surface-diffusion-mediated deposition (SDMD), the method comprising:

forming a dielectric layer above a substrate;

forming a molecular layer on the dielectric layer;

forming a region of metal atoms above the substrate proximate to, but separate from, the molecular layer; and forming a metal contact by migrating metal atoms from the region of metal atoms onto the molecular layer.

20. The method of claim 19, wherein the dielectric layer is selected from the group consisting of silicon dioxide, aluminum oxide, and hafnium oxide.

* * * * *